(12) United States Patent
Ho et al.

(10) Patent No.: US 10,747,693 B2
(45) Date of Patent: Aug. 18, 2020

(54) SEMICONDUCTOR DEVICE WITH A TIME MULTIPLEXING MECHANISM FOR SIZE EFFICIENCY

(71) Applicant: Micron Technology, Inc., Boise, ID (US)

(72) Inventors: Michael V. Ho, Allen, TX (US); Ravi Kiran Kandikonda, Frisco, TX (US)

(73) Assignee: Micron Technology, Inc., Boise, ID (US)

( * ) Notice: Subject to any disclaimer, the term of this patent is extended or adjusted under 35 U.S.C. 154(b) by 61 days.

(21) Appl. No.: 15/976,726

(22) Filed: May 10, 2018

(65) Prior Publication Data
US 2019/0347223 A1  Nov. 14, 2019

(51) Int. Cl.
*G06F 13/16* (2006.01)
*G06F 13/20* (2006.01)
*G06F 3/06* (2006.01)
*G11C 11/4063* (2006.01)
*G06F 13/40* (2006.01)

(52) U.S. Cl.
CPC ........ *G06F 13/1689* (2013.01); *G06F 3/0604* (2013.01); *G06F 3/0659* (2013.01); *G06F 3/0673* (2013.01); *G06F 13/4068* (2013.01); *G11C 11/4063* (2013.01)

(58) Field of Classification Search
CPC ............. G06F 3/06; G06F 13/16; G06F 13/40
USPC .......................................................... 710/5
See application file for complete search history.

(56) References Cited

U.S. PATENT DOCUMENTS

| | | | | |
|---|---|---|---|---|
| 5,914,898 A | * | 6/1999 | Sher | G11C 7/1057 326/27 |
| 6,405,273 B1 | * | 6/2002 | Fleck | G06F 13/1678 710/310 |
| 8,050,117 B2 | * | 11/2011 | Ko | G11C 7/1045 365/191 |
| 9,123,398 B2 | * | 9/2015 | Lee | G11C 7/1066 |
| 9,830,960 B2 | * | 11/2017 | Lee | G11C 7/1057 |
| 2015/0089164 A1 | * | 3/2015 | Ware | G11C 5/02 711/149 |
| 2015/0262464 A1 | * | 9/2015 | Goldenson | G08B 17/11 340/629 |
| 2016/0357453 A1 | * | 12/2016 | Kim | G06F 3/0611 |
| 2016/0357456 A1 | * | 12/2016 | Iwasaki | G06F 3/0613 |
| 2017/0323678 A1 | * | 11/2017 | Kim | G11C 11/419 |

* cited by examiner

*Primary Examiner* — Christopher B Shin
(74) *Attorney, Agent, or Firm* — Perkins Coie LLP (57) ABSTRACT

A memory device includes a first set of data input/output (I/O) devices configured to communicate a first portion of a data unit to or from an external controller; a second set of data I/O devices configured to communicate a second portion of the data unit to or from the external controller; a data control circuit can share the internal global data lines by multiplexing the timings of the first and second sets of data I/O devices, the data control circuit configured to route the data unit according to a data operation corresponding to the data unit; and a shared data bus coupling both the first set of data I/O devices and the second set of data I/O devices to the data control circuit, the shared data bus configured to relay both the first portion and the second portion of the data unit.

20 Claims, 6 Drawing Sheets

SEMICONDUCTOR DEVICE WITH A TIME MULTIPLEXING MECHANISM FOR SIZE EFFICIENCY

TECHNICAL FIELD

The disclosed embodiments relate to memory devices, and, in particular, to memory devices with a signal management mechanism.

BACKGROUND

Memory systems can employ memory devices to store and access information. The memory devices can include volatile memory devices, non-volatile memory devices, or a combination device. Memory devices, such as dynamic random-access memory (DRAM), can utilize electrical energy to store and access data. For example, the memory devices can include Double Data Rate (DDR) RAM devices that implement DDR interfacing scheme (e.g., DDR4, DDR5, etc.) for high-speed data transfer.

Figure 1:
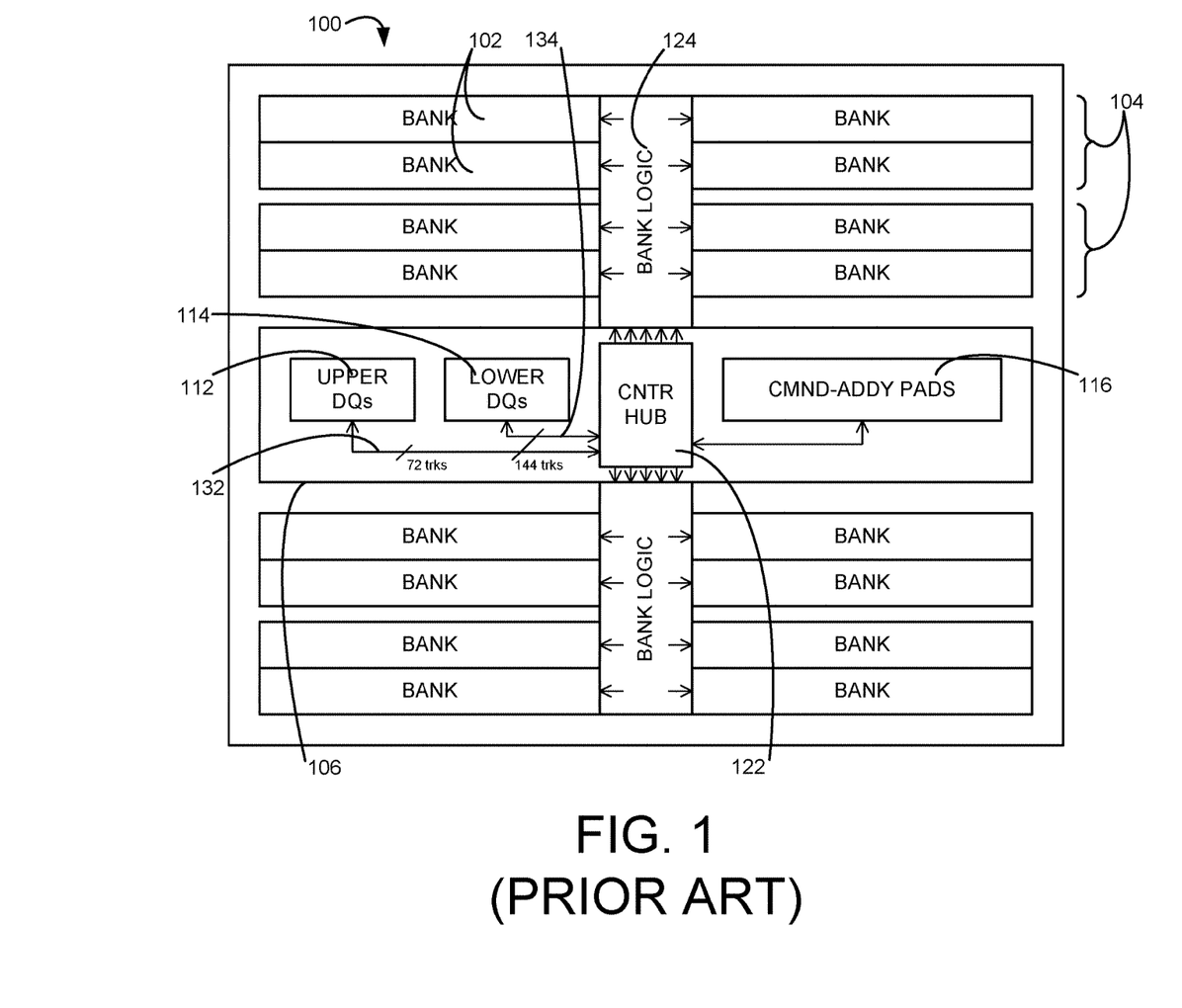
FIG. 1 illustrates a block diagram of a memory device.

FIG. 1 illustrates a block diagram of a memory device 100 (e.g., a DRAM device) that utilize electrical energy to store and access data. For example, the memory device 100 can include memory banks 102 that are organized/configured according to one or more bank groups 104. Each of the bank groups 102 can include a set of two or more memory banks 102. In some embodiments, each of the bank groups 104 can include a set of four or eight memory banks 102.

The memory device 100 can further include an input/output (I/O) circuit 106 configured to communicate data (e.g., DQ, RDQS, DBI, DMI, etc.), command, and/or address signals. In some embodiments, the I/O circuit 106 can include a first set of data I/Os 112 (e.g., pads/receivers for upper data (DQs <15:8>)), a second set of data I/Os 114 (e.g., pads/receivers for lower data (DQ <7:0>)), etc. For example, the memory device 100 may communicate the data in units of 16 or 32 bits. The first data I/Os 112 can communicate an upper portion (e.g., an upper nibble, an upper byte, an upper word/half, etc.). The second data I/Os 114 can communicate a lower portion (e.g., a lower nibble, a lower byte, a lower word/half, etc.). The terms "upper" and "lower" can correspond to the bytes (or 8 data set). For X4/X8 configuration, the lower byte can be DQ<3:0> or DQ<7:0> are used (while the upper bytes DQ<15:8> are not used externally or internally). For X16 configuration, both upper bytes and lower bytes will be used at the same time. In Read or Write operations, there are certain defined burst length (e.g., BL=8 means 8 data bits are written in or read out) for each data set. The Read and Write operations are reversed where Read uses Parallel To Serial FIFO to clock out 8 bits serially whereas Write uses Serial To Parallel latches to line up data parallelly. The handshake of external control and internal control helps to make the bi-directional data propagation back and forth between Array and IO.

In some embodiments, the data I/Os can include data masks, such as an upper data mask (UDM) and upper data strobe (UDQS/UDQSF) for the first data I/Os 112 and a lower data mask (LDM) and lower data strobe (LDQS/LDQSF) for the second data I/Os 114, used to cover non-overlapping portions of the data unit. The memory device 100 can use the data masks to cover a portion of the data and keep the portion untouched, while writing to the uncovered portion of the data.

In some embodiments, the I/O circuit 106 can include a set of command and/or address pads 118. The command/address pads 118 can be configured to communicate/receive commands (e.g., read/write/erase commands from a controller/processor) and/or addresses associated with the data.

The communicated data, command, address, etc. can be routed to/from the corresponding location (e.g., the particular/designated set of data cells). In some embodiments, the I/O circuit 106 can include a center hub 122, bank logics 124, etc. The center hub 122 can be configured to perform the bank group or group-level control. The bank logic circuits 124 can be configured to perform the bank-level control. The center hub 122, the bank logic circuitry 124, etc. can include a set of drivers (e.g., one-directional drivers and/or bi-directional drivers) for communicating the data with the memory banks 102.

The memory device 100 can correspond to a wide I/O device configured to process relatively large amounts of data to keep up with increasing computer/processor performances. Further, the memory device 100 (e.g., DRAM) can have/support various I/O configurations, such as X4, X8, X16, etc. The I/O configurations can include multiple sets of data buses that connect the center hub 122 and the data I/Os. For example, the center hub 122 can be connected (e.g., direct connection) to the first data I/Os 112 through a first data bus 132. Also, the center hub 122 can be similarly connected to the second data I/Os 114 through a second data bus 134. In some embodiments (e.g., X16 configurations), the first data bus 132 and the second data bus 134 can each include 72 tracks for communicating data/information/bits between the I/Os and the center hub 122. Accordingly, a combined bus (e.g., between the center hub 122 and the second data I/Os 114) can include 144 tracks.

For communicating/processing the information, the memory device 100 can include one or more circuit components (e.g., drivers, receiver, logic, etc.) for each I/O track. Further, in order to support the various I/O configurations, the memory device 100 can include additional circuit components (e.g., drivers, receiver, logic, etc.) for each I/O track. While each processing circuit component requires die space, the additional circuit components (e.g., configured to support the various I/O configurations) further complicate the data management and increase the physical size of the memory device 100.

With technological advancements in other areas and increasing applications, the market is continuously looking for faster, smaller, and more efficient devices. To meet the market demand, the semiconductor devices are being pushed to the limit. In view of the ever-increasing commercial competitive pressures, along with growing consumer expectations and the desire to differentiate products in the marketplace, it is increasingly desirable that answers be found to these problems. Additionally, the need to reduce costs, improve efficiencies and performance, and meet competitive pressures adds an even greater pressure to find answers to these problems.

DETAILED DESCRIPTION

As described in greater detail below, the technology disclosed herein relates to memory devices, systems with memory devices, and related methods for managing information bus traffic. For example, the memory devices (e.g., DRAMs configured for DDR interface) described below can communicate increased number of bits over a reduced number of information lines in comparison to traditional configurations that include a larger number of information lines that each carry one bit. To increase the communication efficiency, the memory devices can include one or more buses that are shared between multiple I/O pads/circuits. The shared bus can include 1/n number of information lines that each communicate n bits instead of traditional devices that include n number of information lines that each carry one bit. In communicating the information over reduced number of lines, the memory devices can time the communication of the n bits based on the different propagation delays that correspond to different bus lengths.

As the memory devices are configured to accommodate increasing number of IO configurations, data management becomes complicated and the number of circuits and data lines in the device increase. Based on managing the bus traffic, the memory devices can reduce the number of data lines without sacrificing data capacity or speed. As a result, the size of the memory device (e.g., die size) can be reduced with no impact on speed or power.

In some embodiments, the memory devices or systems can include wide input/output (IO) devices/systems that process larger amounts of data in shorter amounts of time. The memory devices (e.g., DRAMs) can include or support a variety of different information bus or IO configurations, such as X4, X8, X16, etc. Data can be strobed in for different groupings (e.g., upper byte and lower byte) at relatively the same time. Inside the memory device, the propagation delay for the data groupings can differ, such as based on bond pad location, circuit layouts, trace lengths, etc. As such, one data grouping (e.g., the upper byte) can experience greater propagation delay than another data grouping (e.g., the lower byte), such as in traversing to/from a global/shared IO circuit (e.g., a center portion of the die) where a set of device functions (e.g., read and/or write bi-directional control, data mask and cyclic redundancy check (CRC), data bus inverse function (DBI), IO X4/X8/X16 configurations (Array Bank Groups/Bank Arrays or data line steering, etc.) and logic reside.

For processing write operations, the corresponding circuit can include a serial to parallel First-In First-Out (FIFO) such that all write data will be lined up and written into the Array at the same time. Processing read operations can be reversed to write, that data grouping can be sent to a parallel to serial FIFO is used to latch the data. The memory device (e.g., data in strobes for write and delayed locked loop for read) can align the data bits with clock signals before interacting with external devices/components.

Both read and write operations can use the same set of data lines. As such, based on controlling the timing of transmission for the faster and slower data groupings and latching them, the memory device can use reduced number of data lines (e.g., by half) in comparison to traditional devices (e.g., 144 data lines). Based on the reduction in data lines, the physical size (e.g., die size) of the device can be reduced, leading to higher yield and lower cost. Since the memory device is leveraging the existing propagation delay to time the data, other performance characteristics (e.g., overall processing speed, power consumption, etc.) can remain unchanged.

Figure 2:
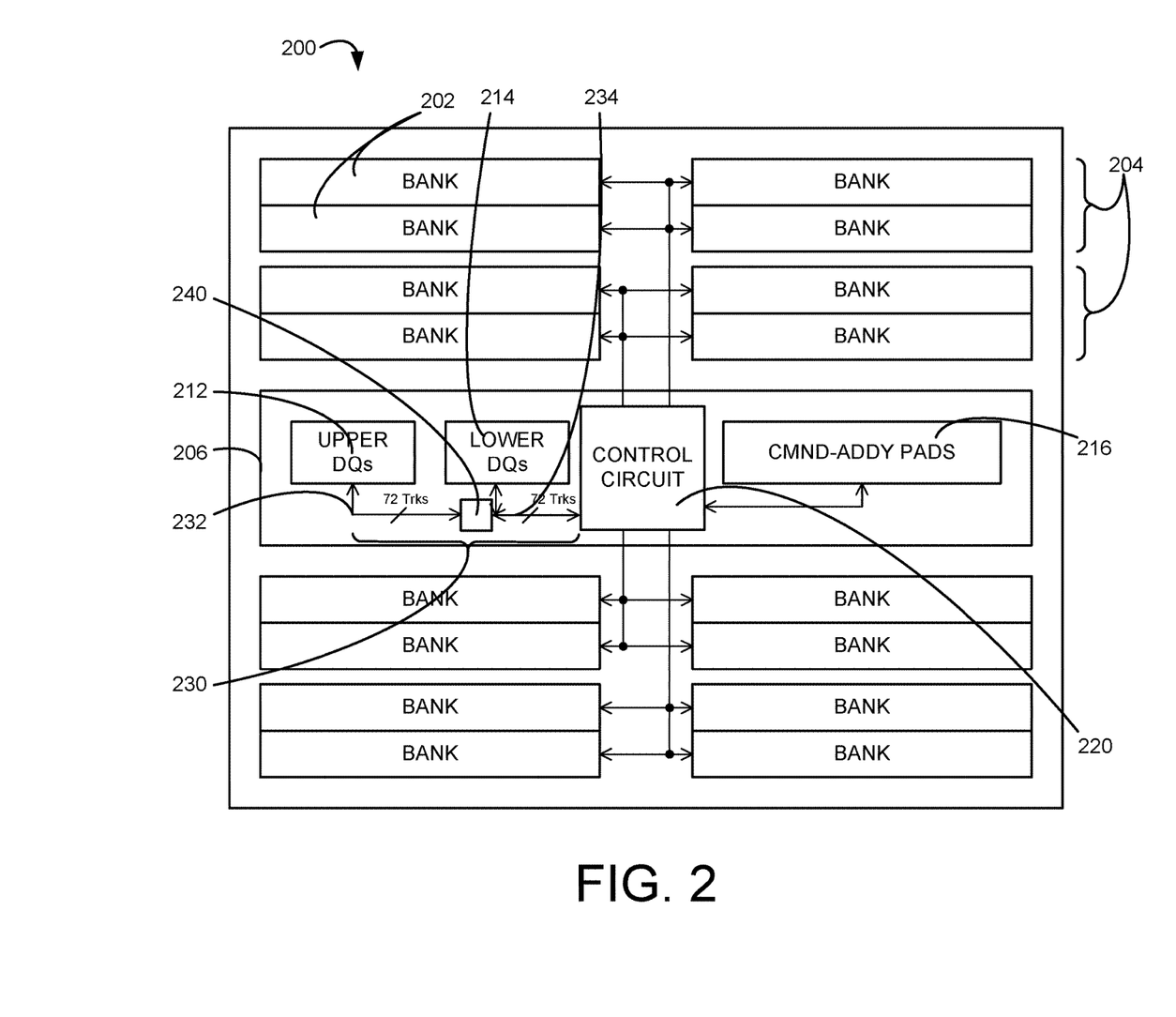
FIG. 2 illustrates a block diagram of a memory device in accordance with an embodiment of the present technology.

FIG. 2 is a block diagram of a memory device 200 (e.g., a semiconductor die assembly, including a 3DI device or a die-stacked package) in accordance with an embodiment of the present technology. For example, the memory device 200 can include a memory device, such as a DRAM (e.g., DDR4 DRAM, DDR5 DRAM, LPDDR4, LPDDR5, Graphic Memory, Specific DRAM, RAMBUS or many semiconductor devices, etc.), or a portion thereof.

The memory device 200 can utilize electrical energy to store and access data. For example, the memory device 200 can include memory banks 202 that are organized/configured according to one or more bank groups 204. Each of the bank groups 204 can include a set of two or more memory banks 202. In some embodiments, each of the bank groups 204 can include a set of four or eight memory banks 202.

The memory device 200 can further include an input/output (I/O) circuit 206 configured to communicate data (e.g., DQ, RDQS, DBI, DMI, etc.), command, and/or address signals. In some embodiments, the I/O circuit 206 can include a first set of data I/Os 212 (e.g., I/O pads/circuits for upper data (DQs <15:8>)), a second set of data I/Os 214 (e.g., I/O pads/circuits for lower data (DQ <7:0>)), etc. For example, the memory device 200 may communicate the data in units of 16 or 32 bits. The first data I/O devices 212 can communicate an upper portion (e.g., an upper nibble, an upper byte, an upper word/half, etc.) of the 16 or 32 bit data units. The second data I/O devices 214 can communicate a lower portion (e.g., a lower nibble, a lower byte, a lower word/half, etc.) of the 16 or 32 bit data units. The data I/Os can include data masks, such as an upper data mask (UDM) for the first data I/O devices 212 and a lower data mask (LDM) for the second data I/O devices 214, used to cover non-overlapping portions of the data unit. The memory device 200 can use the data masks to cover a portion of the data and keep the portion untouched, while writing to the uncovered portion of the data.

In some embodiments, the I/O circuit 206 can include a set of command and/or address pads 218. The command/address pads 218 can be configured to communicate/receive commands (e.g., read/write/erase commands from a controller/processor) and/or addresses associated with the data.

The communicated data, command, address, etc. can be routed to/from the corresponding location (e.g., the particular/designated set of data cells). In some embodiments, the I/O circuit 206 can include a data control circuit 220 configured to implement the signal routing control (e.g., bank-level control and bank-group level control). The data control circuit 220 can be coupled (e.g., directly, without any intervening circuitry) to the bank groups 204, the memory banks 202, etc. The memory device 200 can include the data control circuit 220 connected to the memory banks 202 directly through one or more connectors/busses, without any logic (e.g., the bank logic circuits 124 of FIG. 1) or circuitry components between the memory banks 202 and the data control circuit 220. In some embodiments, the data control circuit 220 can include drivers, receivers, buffers, latches, FIFO buffers, serial-to-parallel buffer, parallel-to-serial buffer, etc.

In some embodiments, the first data I/O devices 212 can be located farther away from the data control circuit 220 in comparison to the second data I/O devices 214. For example, the upper DQs (e.g., corresponding to the first data I/O devices 212) can travel a distance that is double the travel distance of the lower DQs (e.g., corresponding to the second data I/O devices 214).

The memory device 200 can correspond to a wide I/O device configured to process relatively large amounts of data to keep up with increasing computer/processor performances. Further, the memory device 200 (e.g., DRAM) can have/support various I/O configurations, such as X4, X8, X16, etc. Instead of multiple dedicated data buses, the memory device 200 can include a shared data bus 230 that connects the data control circuit 220 to the data I/Os (e.g., the first data I/O devices 212 and the second data I/O devices 214). In some embodiments (e.g., X16 configurations), the shared data bus 230 can include 72 tracks that support multiple sets of data I/Os (e.g., both the first data I/O devices 212 and the second data I/O devices 214). As such, the shared data bus 230 or a portion thereof can be used to communicate both the upper DQs and the lower DQs.

The shared data bus 230 can include a first bus section 232, a second bus section 234, a multiplexer-control circuit 240, etc. The first bus section 232 can be connected to the first data I/O devices 212, and the second bus section 234 can be connected to the second data I/O devices 214. As such, the first bus section 232 can communicate the upper DQs to/from the first data I/O devices 212, and the second bus section 234 can communicate the lower DQs to/from the second data I/O devices 214. The first bus section 232 and the second bus section 234 can be connected to each other through the multiplexer-control circuit 240.

The multiplexer-control circuit 240 can be configured to manage the traffic/communication through the shared data bus 230 so that the bus can accommodate both the upper DQs and the lower DQs. For example, the multiplexer-control circuit 240 can include latches, buffers, multiplexer, switches, FIFO buffers, etc. configured to control access timings for the different sets of data pads. The multiplexer-control circuit 240 and/or the data control circuit 220 can implement a time-division multiplexing (TDM) scheme to communicate multiple sets of data over the shared data bus 230.

In some embodiments, the multiplexer-control circuit 240 and/or the data control circuit 220 can be configured to leverage the differences in propagation delay for the data groupings. While the data (e.g., DQ) can be strobed in for different groupings (e.g., upper byte and lower byte) at relatively the same time, they can experience different amounts of delays as a result of bond pad location, circuit layouts, trace lengths, etc. As such, one data grouping (e.g., the upper DQs) can experience greater propagation delay than another data grouping (e.g., the lower DQs) in traversing between the corresponding I/Os and the data control circuit 220.

The propagation differences can be leveraged differently according to the operations (e.g., write, read, etc.). For example, for read operations the data control circuit 220 can latch the data in a parallel-to-serial FIFO. The multiplexer-control circuit 240 and/or the data control circuit 220 can be configured to first communicate the slower or farther-traveling upper DQs (e.g., X16) through the shared data bus 230. Afterwards, the shared data bus 230 can be released, and then loaded with the lower DQs (e.g., X4/X8) for the write operation. The multiplexer-control circuit 240 can connect/isolate the first data I/O devices 212 and the second data I/O devices 214 according to the described processing sequence. The slower/longer-travelling upper DQs can be communicated first such that they can be sent out close in time to the faster/shorter-traveling lower DQs.

Also, for write operations, the multiplexer-control circuit 240 and/or the data control circuit 220 can be configured to propagate and latch in an order opposite than the read operation. For write operations, the data can be latched at a serial-to-parallel FIFO in the data control circuit 220. The multiplexer-control circuit 240 and/or the data control circuit 220 can be configured to first communicate the faster or nearer lower DQs (e.g., X4/X8). The lower DQs can be latched, and then the shared data bus 230 can be released. Subsequently, the upper DQs (e.g., X16) can be loaded onto the shared data bus 230. The lower DQs can be communicated first such that the shared data bus 230 can be released earlier, thereby decreasing a delay in communicating the farther/upper DQs.

The multiplexer-control circuit 240 and/or the data control circuit 220 using the shared data bus 230 to communicate both the upper DQs and the lower DQs provides reduced circuit size and reduced complexity. By communicating the separate DQs through the same shared bus, the memory device 200 can have a reduced number of tracks (e.g., 72 tracks in comparison to the 144 tracks in the memory device 100 of FIG. 1). The reduced number of tracks can further correspond to a reduction the circuitry (e.g., drivers, receivers, etc.) that correspond to each track. Further, the reduction in the tracks can reduce the number of corresponding DC shields used to preserve signal integrity of the carried signals. As a result of the reductions, the device performance can be increased/preserved while reducing the die sizes. The reduction in die sizes can further provide increased yield/profit.

Figure 3:
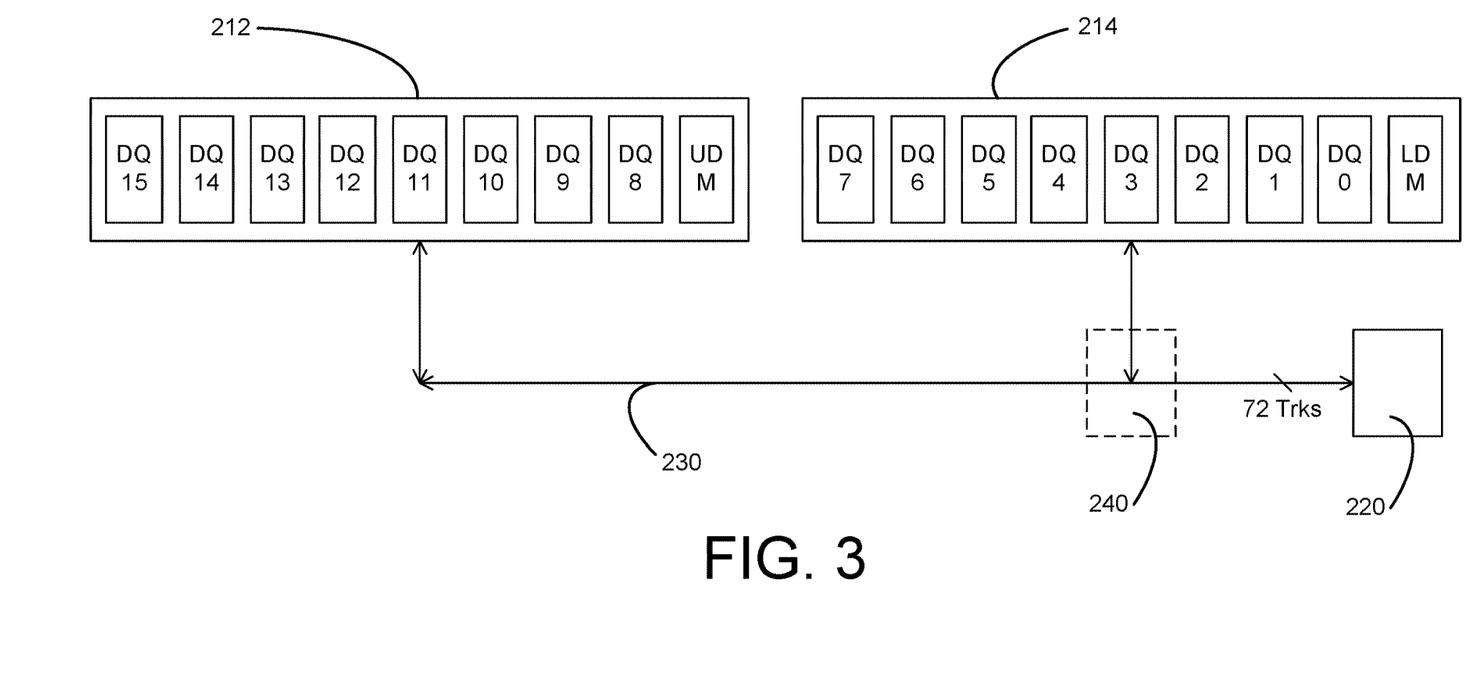
FIG. 3 illustrates a block diagram of a shared bus in accordance with an embodiment of the present technology.

FIG. 3 illustrates a block diagram of a shared bus (e.g., the shared data bus 230) in accordance with an embodiment of the present technology. The shared data bus 230 can use the same set of tracks to communicate data (e.g., DQ) to/from multiple sets of I/Os. For example, the shared data bus 230 can include 72 tracks connected to both the first set of data I/Os 212 and the second set of data I/Os 214. Accordingly, the shared data bus 230 can communicate both the upper byte (e.g., the upper DQ<16:8>) and the lower byte (e.g., the lower DQ<7:0>), such as based on a TDM scheme. For example, a set of tracks can be used to communicate DQ<13> at one time and DQ<7> at a different time. In some embodiments, the shared bus can include the multiplexer-control circuit 240 configured to connect the tracks/segments to different I/Os to facilitate the multiplexing scheme.

Figure 4A:
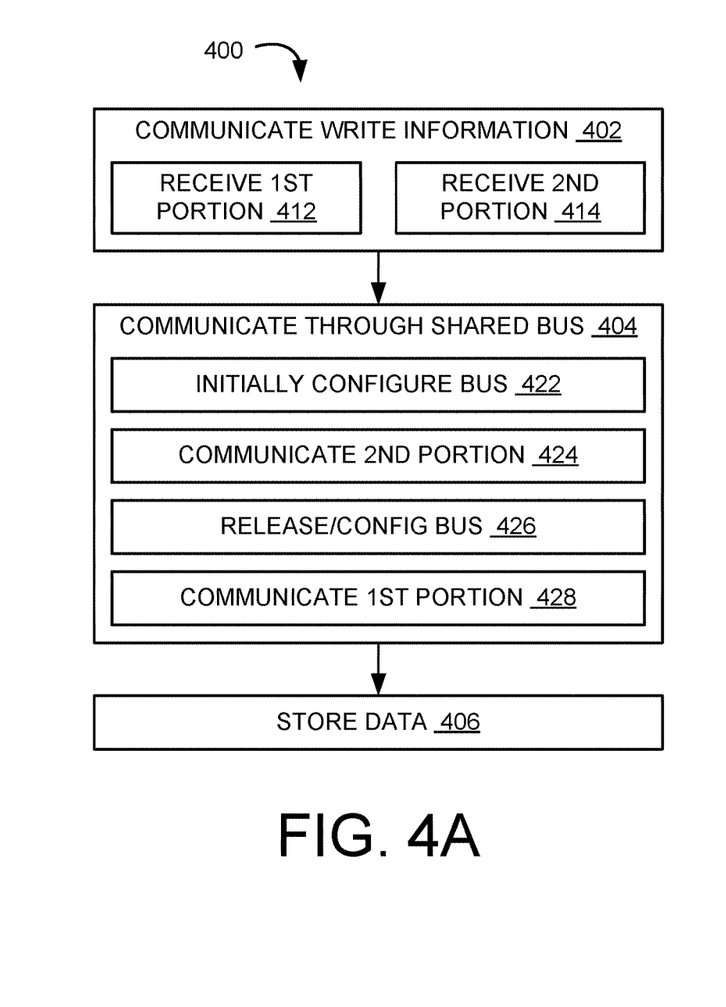
FIG. 4A illustrates a flow diagram illustrating an example method of operating a memory device in accordance with an embodiment of the present technology.

FIG. 4A illustrates a flow diagram illustrating an example method 400 of operating a memory device (e.g., the memory device 200 of FIG. 2) in accordance with an embodiment of the present technology. The method 400 can correspond to a write operation.

At block 402, the memory device 200 can communicate (e.g., receive) write information (e.g., a command, an address, content data, etc.) with an external device (e.g., a controller, a CPU, etc.). At block 412, the memory device 200 (e.g., through the first data I/O devices 212 of FIG. 2) can receive the first portion of the content data from the external device. At block 414, the memory device 200 (e.g., through the second data I/O devices 214 of FIG. 2) can receive the second portion of the content data from the external device.

At block 404, the memory device 200 can internally communicate the content data. For example, the memory device 200 (e.g., the data control circuit 220 of FIG. 2, the multiplexer-control circuit 240 of FIG. 2, etc.) can communicate the content data through the shared data bus 230 of FIG. 2, such as from the first and second data I/Os to the data control circuit 220. The memory device 200 can leverage the differences in distances/propagation delays for the first bus section 232 of FIG. 2 and/or the second bus section 234 of FIG. 2 for the internal communication. For example, the memory device 200 can communicate the first portion and the second portion at different times that correspond to a difference in propagation delay that is at least associated with a difference in separation distances. Also, for the write operation, the memory device 200 can communicate the second portion through the shared data bus 230 before the first portion.

At block 422, the memory device 200 (e.g., the data control circuit 220, the multiplexer-control circuit 240, etc.) can initially configure the shared data bus 230 to communicate the second portion of the content data. For example, the data control circuit 220 and/or the multiplexer-control circuit 240 can connect the second data I/O devices 214 to the data control circuit 220 through the second bus section 234. Also, the data control circuit 220 and/or the multiplexer-control circuit 240 can isolate the first data I/O devices 212 and/or the first bus section 232 from the data control circuit 220 and/or the second bus section 234. At block 424 corresponding to a first time, the memory device 200 can communicate the second portion of the content data from the second set of data I/Os 214 to the data control circuit 220 through the initially configured shared data bus 230.

At block 426, following the communication of the second portion, the memory device 200 (e.g., the data control circuit 220, the multiplexer-control circuit 240, etc.) can release the shared data bus 230, such as by resetting or removing the initial configurations. Further, after releasing the shared data bus 230, the memory device 200 (e.g., the data control circuit 220, the multiplexer-control circuit 240, etc.) can configure the shared data bus 230 to couple the first data I/O devices 212 to the data control circuit 220. For example, the data control circuit 220 and/or the multiplexer-control circuit 240 can connect the first data I/O devices 212 to the data control circuit 220 through the first bus section 232 and/or the second bus section 234 or a portion thereof. Also, the data control circuit 220 and/or the multiplexer-control circuit 240 can isolate the second data I/O devices 214 and/or the a portion of the second bus section 234 from the data control circuit 220. At block 428 corresponding to a second time subsequent to the first time, the memory device 200 can communicate the first portion of the content data from the first set of data I/Os 212 to the data control circuit 220 through the configured shared data bus 230.

At block 406, the memory device 200 can store the content data in the targeted memory bank. For example, the data control circuit 220 can latch the first and second portions of the content data into a serial-to-parallel FIFO. Subsequently, the data control circuit 220 can access a targeted bank from within the memory banks 202 of FIG. 2 according to the memory command, address, etc. corresponding to the write data. Accordingly, the data control circuit 220 can facilitate storing/writing the content data (e.g., the first and second sections) to the targeted bank.

Figure 4B:
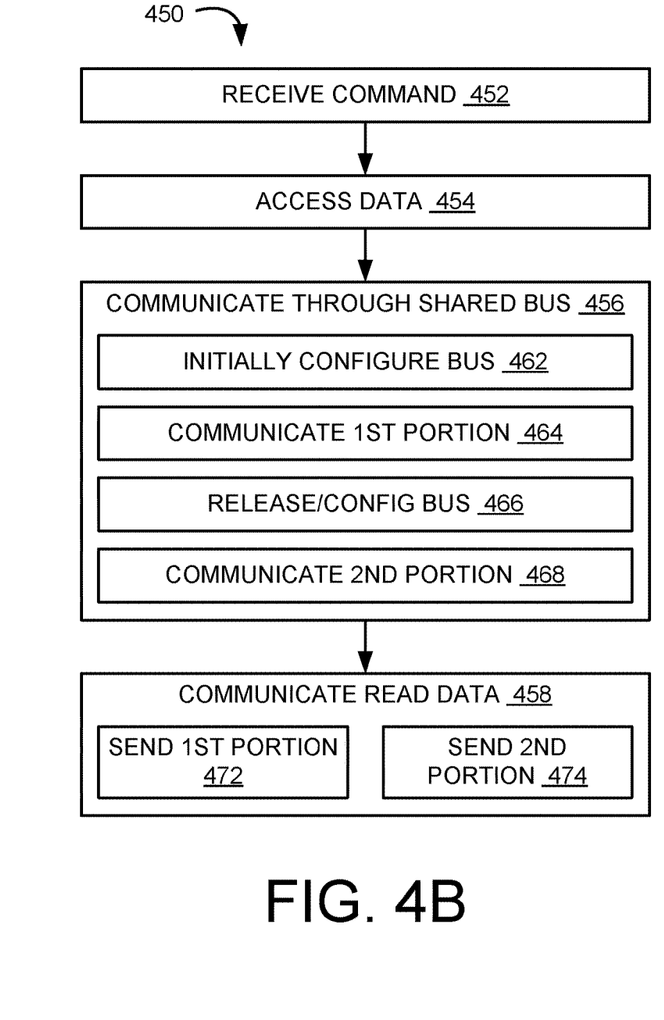
FIG. 4B illustrates a flow diagram illustrating a further example method of operating a memory device in accordance with an embodiment of the present technology.

FIG. 4B illustrates a flow diagram illustrating a further example method 450 of operating a memory device (e.g., the memory device 200 of FIG. 2) in accordance with an embodiment of the present technology. The method 450 can correspond to a read operation.

At block 452, the memory device 200 can receive information (e.g., a command, an address, etc.) associated with the read operation. At block 454, the memory device 200 (e.g., the data control circuit 220 of FIG. 2) can access the targeted/stored content data according to the address. In some embodiments, the data control circuit 220 can latch the accessed content data in a parallel-to-serial FIFO.

At block 456, the memory device 200 can internally communicate the content data. For example, the memory device 200 (e.g., the data control circuit 220, the multiplexer-control circuit 240 of FIG. 2, etc.) can communicate the content data through the shared data bus 230 of FIG. 2, such as from the data control circuit 220 to the first and second data I/Os. The memory device 200 can leverage the differences in distances/propagation delays for the first bus section 232 of FIG. 2 and/or the second bus section 234 of FIG. 2 for the internal communication. For example, the memory device 200 can communicate the first portion and the second portion at different times that correspond to a difference in propagation delay that is at least associated with a difference in separation distances. Also, for the read operation, the memory device 200 can communicate the first portion through the shared data bus 230 before the second portion.

At block 462, the memory device 200 (e.g., the data control circuit 220, the multiplexer-control circuit 240, etc.) can initially configure the shared data bus 230 to communicate the first portion of the content data. For example, the data control circuit 220 and/or the multiplexer-control circuit 240 can connect the first data I/O devices 212 to the data control circuit 220 through the second bus section 234. Also, the data control circuit 220 and/or the multiplexer-control circuit 240 can isolate the second data I/O devices 214 and/or the second bus section 234 from the data control circuit 220. At block 464 corresponding to a first time, the memory device 200 can communicate the first portion of the content data from the first set of data I/Os 212 to the data control circuit 220 through the initially configured shared data bus 230.

At block 466, following the communication of the first portion, the memory device 200 (e.g., the data control circuit 220, the multiplexer-control circuit 240, etc.) can release the shared data bus 230, such as by resetting or removing the initial configurations. Further, after releasing the shared data bus 230, the memory device 200 (e.g., the data control circuit 220, the multiplexer-control circuit 240, etc.) can configure the shared data bus 230 to couple the second data I/O devices 214 to the data control circuit 220. For example, the data control circuit 220 and/or the multiplexer-control circuit 240 can connect the second data I/O devices 214 to the data control circuit 220 through the second bus section 234. Also, the data control circuit 220 and/or the multiplexer-control circuit 240 can isolate the first data I/O devices 212 from the data control circuit 220. At block 468 corresponding to a second time subsequent to the first time, the memory device 200 can communicate the second portion of the content data from the second set of data I/Os 214 to the data control circuit 220 through the configured shared data bus 230.

At block 458, the memory device 200 can communicate (e.g., send) read information (e.g., the content data) with an external device (e.g., a controller, a CPU, etc.). At block 472, the memory device 200 (e.g., through the first data I/O devices 212) can send the first portion of the content data to the external device. At block 474, the memory device 200 (e.g., through the second data I/O devices 214) can send the second portion of the content data to the external device.

Figure 5:
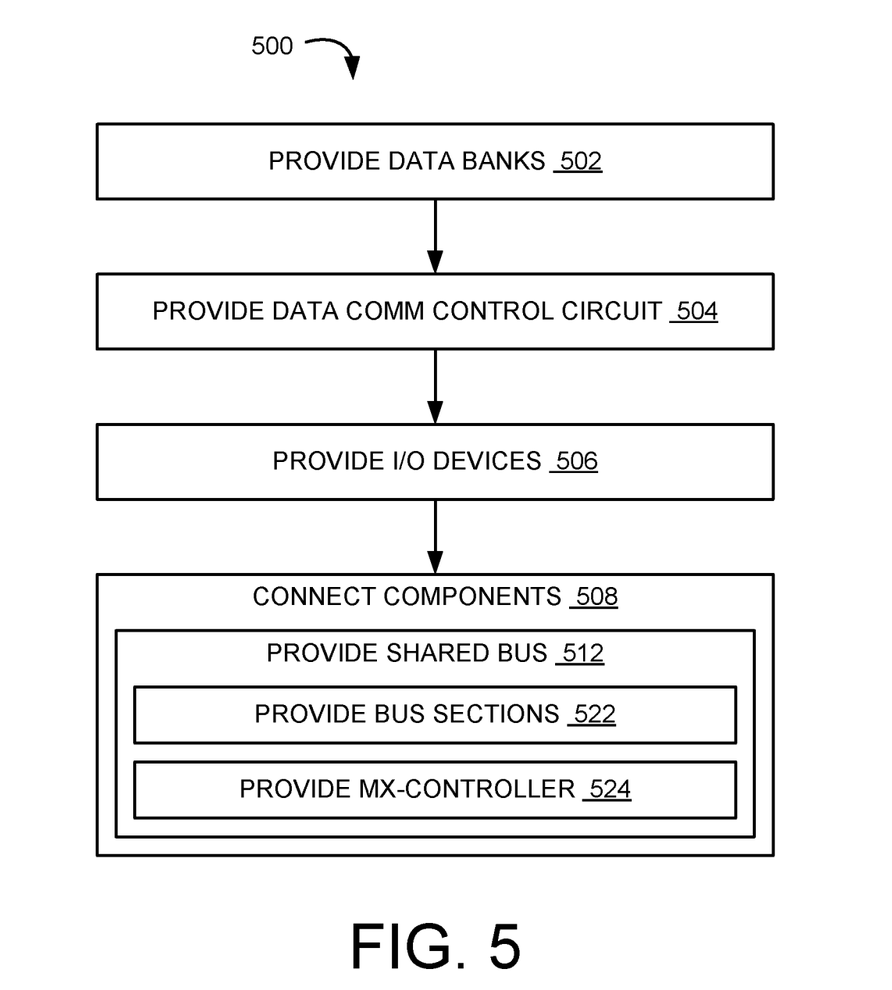
FIG. 5 illustrates a flow diagram illustrating an example method of manufacturing a memory device in accordance with an embodiment of the present technology.

FIG. 5 illustrates a flow diagram illustrating an example method 500 of manufacturing a memory device (e.g., the memory device 200 of FIG. 2) in accordance with an embodiment of the present technology. For example, the method 500 can be for manufacturing a DRAM (e.g., a DDR DRAM) device including the shared data bus 230 of FIG. 2 to internally communicate multiple bits at different timing (e.g., using TDM).

At block 502, storage devices (e.g., the memory banks 202 of FIG. 2) can be provided. In some embodiments, providing the storage devices can include attaching the memory banks 202 to a substrate, a frame, a circuit board, a chassis, other circuit components, etc. In some embodiments, providing the storage devices can include forming the memory banks 202 (e.g., the memory cells) using wafer-level or semiconductor-level manufacturing processes.

At block 504, data communication control circuits (e.g., the data control circuit 220 of FIG. 2) can be provided. For example, providing the communication control circuits can include attaching or providing logic devices, circuit components, gates/transistors, etc. Also, providing the communication control circuits can include configuring (e.g., programming gates, loading instructions, etc.) the data control circuit 220 to manage the data communication as described above.

At block 506, I/O devices (e.g., the first data I/O devices 212 of FIG. 2, the second data I/O devices 214 of FIG. 2, the command-address pads 216 of FIG. 2, etc.) can be provided. For example, providing the I/O devices can include attaching or providing pads, receiver, drivers, buffers, etc.

At block 508, the circuit components can be connected. At block 512, the shared data bus 230 can be provided and connected to the internal components, such as between the data I/O devices and the data control circuit 220. At block 522, bus sections (e.g., the first bus section 232 of FIG. 2, the second bus section 234 of FIG. 2, etc.) can be provided in providing the shared data bus 230. For example, the first bus section 232 can be formed or connected to the first data I/O devices. The second bus section 234 can be formed or connected to the second data I/O devices, the first bus section 232, the data control circuit 220, etc. The second bus section 234 can be provided to continue the tracks in the first bus section 232, such as for forming a series connection. At block 524, the multiplexer-control circuit 240 of FIG. 2 can be provided in providing the shared data bus 230. For example, the multiplexer-control circuit 240 can be formed or connected to the first bus section 232 and the second bus section 234, between the two bus sections, etc. Also, the multiplexer-control circuit 240 can be configured to connect/release the sections as described above.

Figure 6:
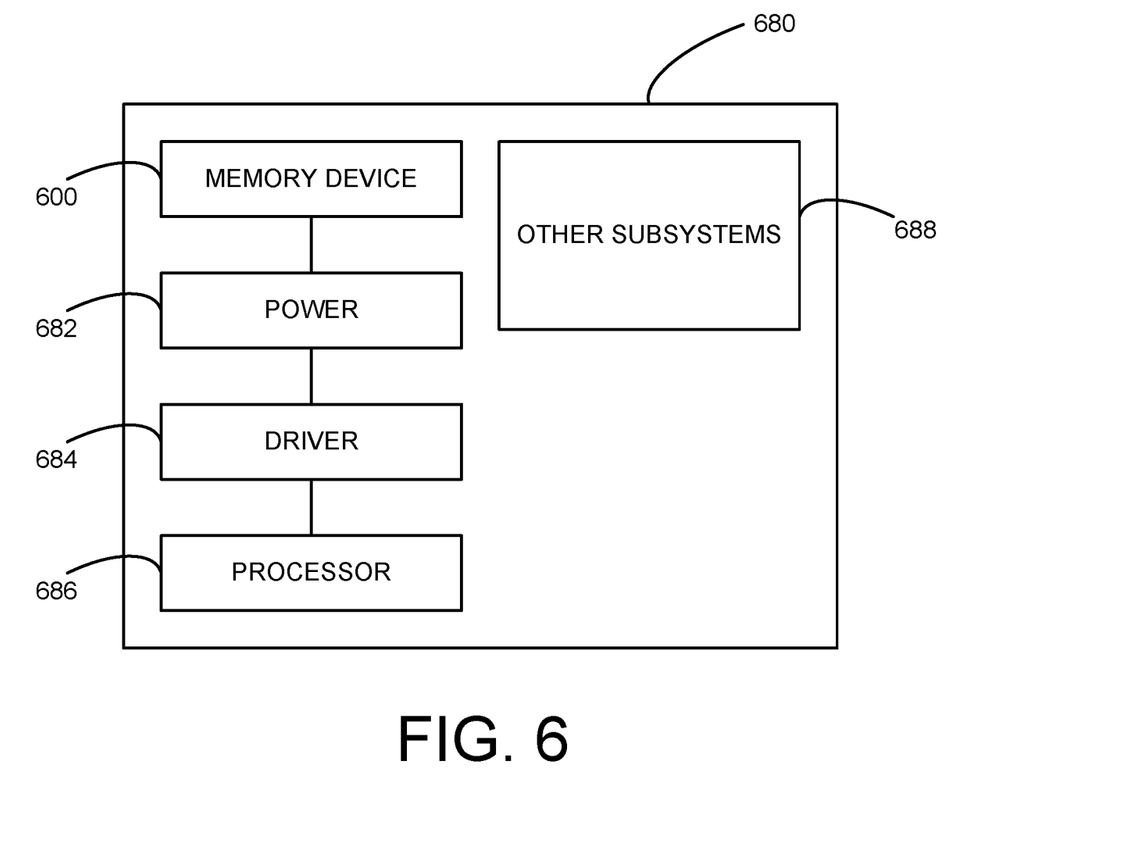
FIG. 6 is a schematic view of a system that includes a memory device in accordance with an embodiment of the present technology.

FIG. 6 is a schematic view of a system that includes a memory device in accordance with embodiments of the present technology. Any one of the foregoing memory devices described above with reference to FIGS. 2-5 can be incorporated into any of a myriad of larger and/or more complex systems, a representative example of which is system 680 shown schematically in FIG. 6. The system 680 can include a memory device 600, a power source 682, a driver 684, a processor 686, and/or other subsystems or components 688. The memory device 600 can include features generally similar to those of the memory device described above with reference to FIGS. 2-5, and can therefore include various features for performing a direct read request from a host device. The resulting system 680 can perform any of a wide variety of functions, such as memory storage, data processing, and/or other suitable functions. Accordingly, representative systems 680 can include, without limitation, hand-held devices (e.g., mobile phones, tablets, digital readers, and digital audio players), computers, vehicles, appliances and other products. Components of the system 680 may be housed in a single unit or distributed over multiple, interconnected units (e.g., through a communications network). The components of the system 680 can also include remote devices and any of a wide variety of computer readable media.

From the foregoing, it will be appreciated that specific embodiments of the technology have been described herein for purposes of illustration, but that various modifications may be made without deviating from the disclosure. In addition, certain aspects of the new technology described in the context of particular embodiments may also be combined or eliminated in other embodiments. Moreover, although advantages associated with certain embodiments of the new technology have been described in the context of those embodiments, other embodiments may also exhibit such advantages and not all embodiments need necessarily exhibit such advantages to fall within the scope of the technology. Accordingly, the disclosure and associated technology can encompass other embodiments not expressly shown or described herein.

In the illustrated embodiments above, the memory devices have been described in the context of devices incorporating DDR based DRAM. Memory devices configured in accordance with other embodiments of the present technology, however, can include other types of suitable storage media in addition to or in lieu of DDR DRAMs, such as NAND or NOR-based storage media, non-volatile storage media, magnetic storage media, phase-change storage media, ferroelectric storage media, etc.

The term "processing" as used herein includes manipulating signals and data, such as writing or programming, reading, erasing, refreshing, adjusting or changing values, calculating results, executing instructions, assembling, transferring, and/or manipulating data structures. The term data structures includes information arranged as bits, words or code-words, blocks, files, input data, system generated data, such as calculated or generated data, and program data.

The above embodiments are described in sufficient detail to enable those skilled in the art to make and use the embodiments. A person skilled in the relevant art, however, will understand that the technology may have additional embodiments and that the technology may be practiced without several of the details of the embodiments described above with reference to FIGS. 2-6.

From the foregoing, it will be appreciated that specific embodiments of the technology have been described herein for purposes of illustration, but that various modifications may be made without deviating from the disclosure. In addition, certain aspects of the new technology described in the context of particular embodiments may also be combined or eliminated in other embodiments. Moreover, although advantages associated with certain embodiments of the new technology have been described in the context of those embodiments, other embodiments may also exhibit such advantages and not all embodiments need necessarily exhibit such advantages to fall within the scope of the technology. Accordingly, the disclosure and associated technology can encompass other embodiments not expressly shown or described herein.

We claim:

1. A memory device, comprising:
   a first set of data input/output (I/O) devices configured to communicate a first portion of a data unit to or from an external controller;
   a second set of data I/O devices configured to communicate a second portion of the data unit to or from the external controller, wherein the second portion is communicated concurrently with the first portion;
   a data control circuit coupled to the first and second sets of data I/O devices, the data control circuit configured to route the data unit according to a data operation corresponding to the data unit; and
   a shared data bus coupling both the first set of data I/O devices and the second set of data I/O devices to the data control circuit, the shared data bus configured to relay the first portion and the second portion of the data unit at different times.

2. The memory device of claim 1, wherein:
   the data unit includes n bits;
   the first set of data I/O devices include upper data (DQ) pads configured to communicate the first portion comprising an upper portion of the n bits; and
   the second set of data I/O devices include lower data (DQ) pads configured to communicate the second portion comprising a portion of the n bits lower than the upper portion.

3. The memory device of claim 2, wherein the data control circuit is configured to:
   process one of either the first portion or the second portion for communication over the shared data bus at a first time; and
   process a remaining of the first portion or the second portion for communication over the shared data bus at a later time.

4. The memory device of claim 1, wherein the shared data bus includes:
   a first bus section directly connected to the first set of data I/O devices, and
   a second bus section directly connected to the second set of data I/O devices and the data control circuit; and
   and wherein the memory device further comprises:
   a multiplex controller coupled to the first bus section and the second bus section, the multiplex controller configured to control the first bus section and the second bus section based on the data operation and signal timing.

5. The memory device of claim 1, wherein a first separation distance between the first set of data I/O devices and the data control circuit is greater than a second distance between the second set of data I/O devices and the data control circuit.

6. The memory device of claim 5, wherein the first separation distance is at least twice the second distance.

7. The memory device of claim 5, wherein the data control circuit is configured to control processing timings of the first portion and the second portion based on a difference in propagation delays that correspond to at least a difference in the separation distances.

8. The memory device of claim 7, wherein the data control circuit is configured to process a write operation based on:
   processing the second portion of the data that is from the nearer second set of data I/O;
   after processing the second portion, processing the first portion of the data that is from the farther first set of data I/O.

9. The memory device of claim 8, further comprising:
   a multiplex controller coupled to a first bus section and a second bus section of the shared data bus, the multiplex controller configured to control the shared data bus based on:
   initially coupling the second set of data I/O to the data control circuit,
   releasing the shared data bus after processing the second portion, and
   connecting the first set of data I/O devices to the data control circuit after the shared data bus is released;
   a memory bank coupled to the data control circuit, the memory bank configured to store information; and
   wherein:
   the data control circuit includes a serial-to-parallel first-in first out (FIFO) buffer configured to:
   latch the first portion and the second portion, and
   send both the first portion and the second portion to the memory bank for storage.

10. The memory device of claim 7, wherein the data control circuit is configured to process a read operation based on:
    processing the first portion of the data that is from the farther first set of data I/O; and
    after processing the first portion, processing the second portion of the data that is from the nearer second set of data I/O.

11. The memory device of claim 10, further comprising:
    a multiplex controller coupled to a first bus section and a second bus section of the shared data bus, the multiplex controller configured to control the shared data bus based on:
    initially coupling the first set of data I/O to the data control circuit,
    releasing the shared data bus after processing the first portion, and
    connecting the second set of data I/O to the data control circuit after the shared data bus is released;
    a memory bank coupled to the data control circuit, the memory bank configured to store information; and
    wherein:
    the data control circuit includes a parallel-to-serial FIFO buffer configured to:
    receive the data unit from the memory bank,
    load the first portion to the shared data bus, and
    load the second portion of the shared data bus after loading the first portion.

12. The memory device of claim 1, wherein the memory device comprises a dynamic random-access memory (DRAM).

13. The memory device of claim 12, wherein the DRAM is configured for double data rate (DDR) interfacing scheme.

14. The memory device of claim 1, wherein the shared data bus includes 72 tracks that are used to communicate both first and second portions of the data.

15. A method of operating a memory device including a first set of data I/O devices and a second set of data I/O devices, the method comprising:
    communicating a first portion of a data unit through the first set of data I/O devices for an external controller;
    communicating a second portion of the data unit through the second set of data I/O devices for the external controller, wherein the second portion is communicated concurrently with the first portion;
    at a first time, communicating the first portion between a data control circuit and the first set of data I/O devices through a shared bus; and at a second time different from the first time, communicating the second portion between the data control circuit and the second set of data I/O devices through the shared bus.

16. The method of claim 15, wherein a difference between the first time and the second time corresponds to a difference in propagation delay that is at least associated with a difference in separation distances between the data control circuit and the first and second sets of data I/O devices.

17. The method of claim 15, wherein communicating the second portion includes communicating the second portion before the first portion for a write operation.

18. The method of claim 17, further comprising:
   initially configuring the shared bus to couple the second set of data I/O devices to the data control circuit;
   releasing the shared data bus after communicating the second portion;
   after releasing, configuring the shared bus to couple the first set of data I/O devices to the data control circuit.

19. The method of claim 15, wherein communicating the first portion includes communicating the first portion before the second portion for a read operation.

20. The method of claim 19, wherein communicating the segment set includes:
   initially configuring the shared bus to couple the first set of data I/O devices to the data control circuit;
   releasing the shared data bus after communicating the first portion;
   after releasing, configuring the shared bus to couple the second set of data I/O devices to the data control circuit.

* * * * *